United States Patent [19]

Widener

[11] Patent Number: 5,004,933
[45] Date of Patent: Apr. 2, 1991

[54] PHASE-SELECTABLE FLIP-FLOP

[75] Inventor: Glenn F. Widener, Hillsboro, Oreg.

[73] Assignee: Tektronix, Inc., Beaverton, Oreg.

[21] Appl. No.: 98,701

[22] Filed: Sep. 18, 1987

Related U.S. Application Data

[63] Continuation of Ser. No. 869,788, Jun. 2, 1986, abandoned.

[51] Int. Cl.⁵ .......................................... H03K 5/135
[52] U.S. Cl. .............................. 307/269; 307/272.1; 307/236; 307/262; 328/72
[58] Field of Search ............... 307/269, 236, 480, 518, 307/262, 247 R, 289, 272 A, 511; 328/208, 133, 134, 55, 115, 109, 118, 201; 375/110

[56] References Cited

U.S. PATENT DOCUMENTS

| | | | |
|---|---|---|---|
| 4,039,960 | 8/1977 | Clark | 307/269 |
| 4,080,576 | 3/1978 | Huber et al. | 328/134 |
| 4,334,157 | 6/1982 | Ferris | 307/291 |
| 4,620,180 | 10/1986 | Carlton | 328/56 |
| 4,627,085 | 12/1986 | Yuen | 307/480 |
| 4,629,909 | 12/1986 | Cameron | 307/279 |
| 4,633,487 | 12/1986 | Goeb et al. | 328/134 |

OTHER PUBLICATIONS

J. W. Cannon, "Phase Selector and Synchronizer for Two-Phase Clock Circuits", vol. 25, No. 11A, Apr. 1983—IBM Technical Disclosure Bulletin.

H. P. Muhfeld, "Trapeze Latch", IBM Technical Disclosure Bulletin, vol. 21, No. 1—Jun. 1978.

T. W. Williams, "Single Clock Shift Register Latch", IBM Technical Bulletin Disclosure—vol. 16, No. 6—Nov. 1973.

Primary Examiner—Stanley D. Miller
Assistant Examiner—Tai V. Duong
Attorney, Agent, or Firm—Francis I. Gray; Boulden G. Griffith

[57] ABSTRACT

A phase-selectable flip-flop has an input dual-enable transparent latch and an output D-type flip-flop. A clock is input to one enable of the transparent latch and to the flip-flop, and a command is input to the second enable of the transparent latch. When the command is in a first state the latch is held transparent and data is clocked into the flip-flop on the rising edge of the clock, and when the command is in a second state data is held by the transparent latch on the falling edge of the clock and clocked into the flip-flop on the succeeding rising edge.

2 Claims, 4 Drawing Sheets

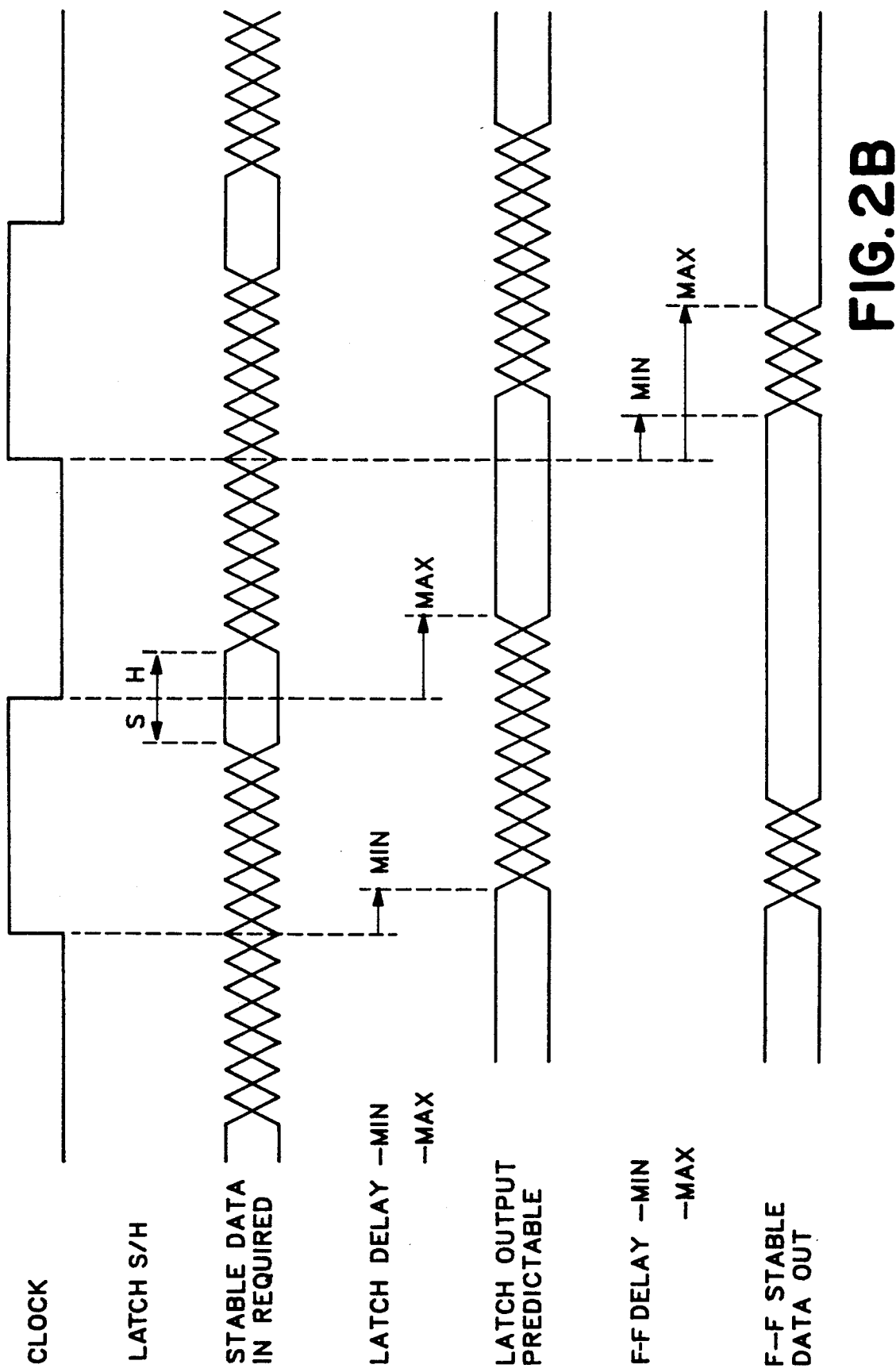

PHASE-SELECTABLE FLIP-FLOP

This is a continuation of application Ser. No. 869,788 filed June 2, 1986 and now abandoned.

BACKGROUND OF THE INVENTION

The present invention relates to timing circuits, and more particularly to a phase-selectable flip-flop which allows selecting one of two sampling times, either on the rising or the falling edge of a clock pulse.

Due to the setup and hold time of latches and flip-flops there is a brief period when there is uncertainty in the transfer of data through such devices. This period is referred to as a metastable region. Where a data input is sampled using a four-phase login circuit, at high clock frequencies on the order of 500 MHz the uncertainty of delay in the data output from each phase is of sufficient duration with respect to the sample clock period that there is no one point at which all four phases can be clocked in order to output them simultaneously on a single clock phase without violating a setup/hold time. Yet at lower sampling rates such a simultaneous point free from uncertainty regions in all phases is attainable. What is desired is a means for inserting a delay in one or more of the phases at high frequency sampling rates to attain a simultaneous point free of uncertainty in all phases, while bypassing the delay at lower sampling rates.

SUMMARY OF THE INVENTION

Accordingly the present invention provides a phase-selectable flip-flop having an input transparent latch with two enables. One enable is tied to a system clock and the other to a control line. By raising the control line the latch is forced transparent, and a succeeding flip-flop clocks data in on the rising clock edge with the setup time increased by the data propagation delay through the transparent latch. With the control line low the data is held in the transparent latch by the falling clock edge of the preceding clock cycle before being clocked into the flip-flop on the rising edge, thereby adding a half clock cycle to the setup time. Thus, a data signal which is stable at one of two setup times is always latchable.

The objects, advantages and novel features of the present invention will be apparent from the following detailed description when read in conjunction with the appended claims and attached drawing.

BRIEF DESCRIPTION OF THE DRAWINGS

FIG. 2B is a timing diagram view of the phase-selectable flip-flop of FIG. 1 when MODE is low.

DESCRIPTION OF THE PREFERRED EMBODIMENT

Figure 1:
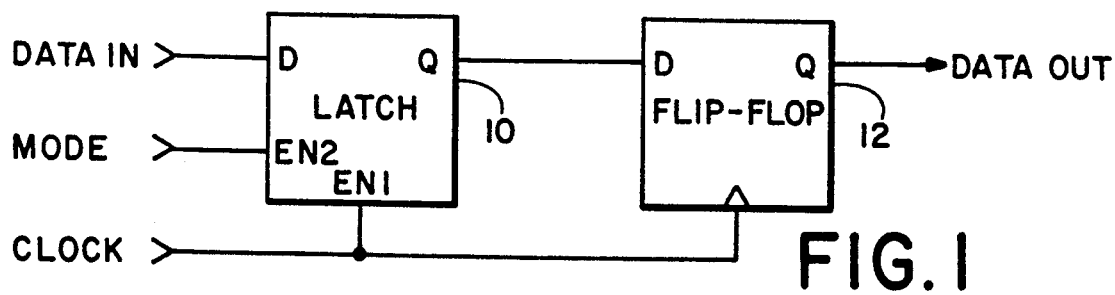
FIG. 1 is a block diagram view of a phase-selectable flip-flop according to the present invention.

Referring now to FIG. 1 an input transparent latch 10 is shown having a data input terminal D, a data output terminal Q and two enables EN1 and EN2, either one of which opens the latch. A system clock is applied to the first enable terminal EN1 of the latch 10, and a mode control line is attached to the second enable terminal EN2 of the latch. A D-type flip-flop 12 is connected to the output Q of the latch 10, the flip-flop being clocked by the system clock.

Figure 2A:
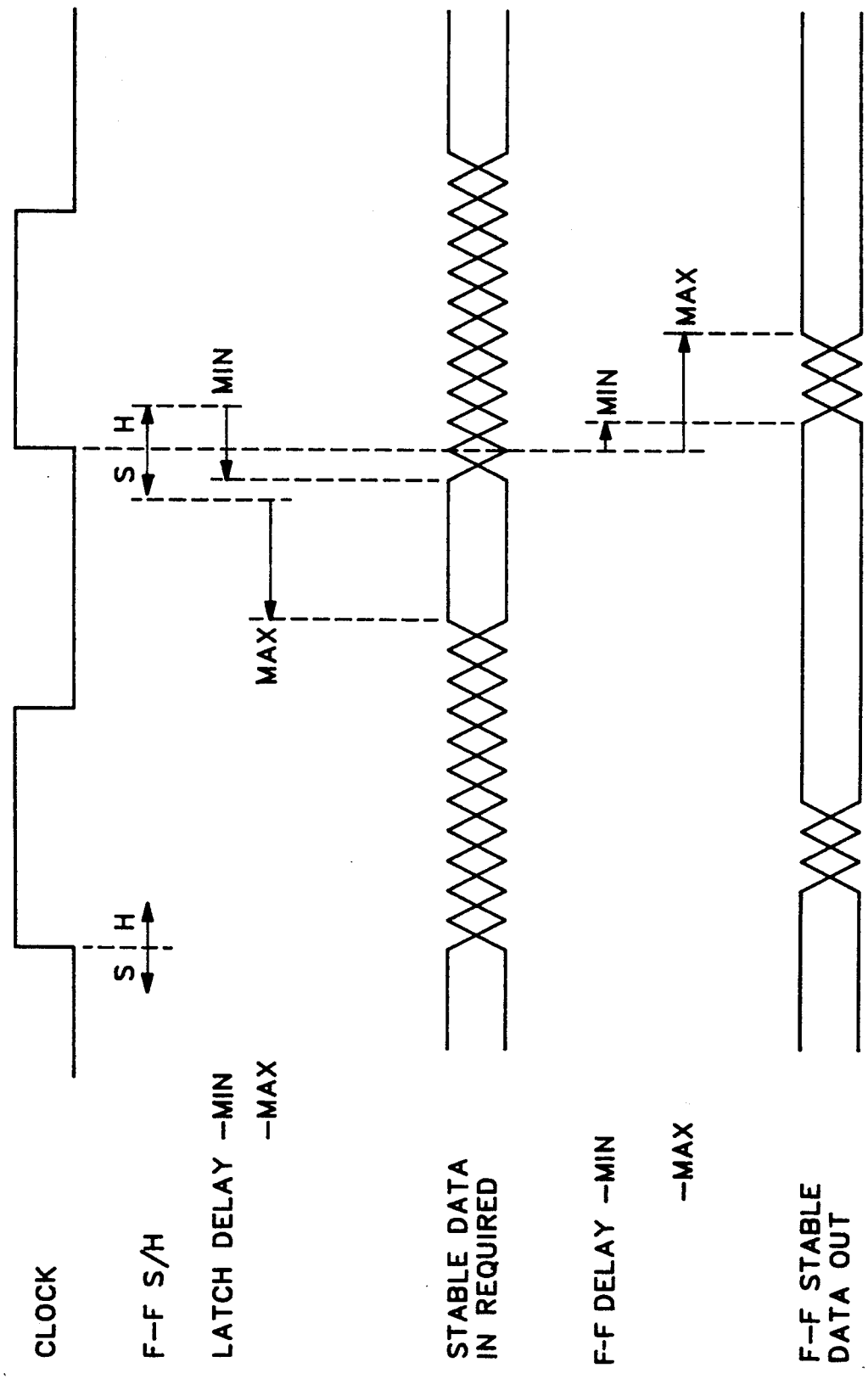
FIG. 2A is a timing diagram view of the phase-selectable flip-flop of FIG. 1 when MODE is high.

The operation of the phase-selectable flip-flop is illustrated by the timing diagrams of FIGS. 2A and 2B. Referring to FIG. 2A in conjunction with FIG. 1, when MODE is high at EN2 of the latch 10, the latch is transparent and the data passes through to the flip-flop 12 where it is clocked in at the rising edge of CLOCK. Referring to FIG. 2B in conjunction with FIG. 1, when MODE is low at EN2 of the latch 10, the latch is controlled by CLOCK at EN1. When CLOCK goes low, the data at the input is latched in and presented to the input of the flip-flop until CLOCK goes high and the latch becomes transparent again. The rising edge of CLOCK clocks this data into the flip-flop.

FIGS. 2A and 2B also show how the setup and hold requirements of the latch and the flip-flop, and the propagation delay through the latch, as well as the uncertainty in this delay, cumulatively contribute to the setup and hold requirements of the phase-selectable flip-flop as a whole.

Figure 3:
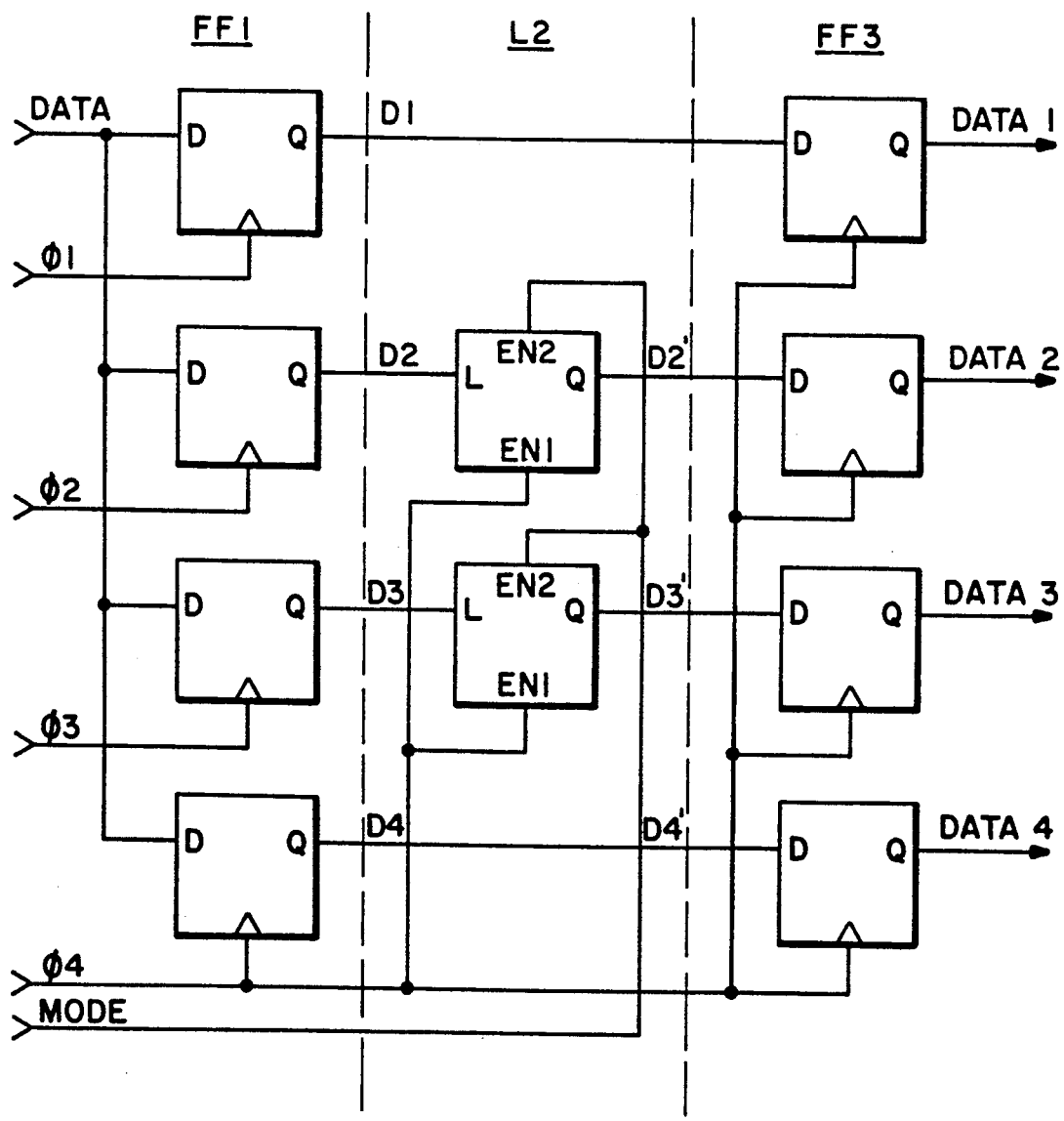
FIG. 3 is a block diagram view of a four-phase data login circuit using the phase-selectable flip-flop of the present invention.

An example of a circuit in which the phase-selectable flip-flop may be used is shown in FIG. 3. A four-phase data login circuit divides the system clock into four phases, 01, 02, 03 and 04, to provide sampling of the input data at four times the system clock. The data is input to a first flip-flop stage FF1, one flip-flop for each clock phase, to provide four parallel data paths. The output is four simultaneous data values from flip-flops FF3 triggered by the leading, or rising, edge of the fourth clock phase, 04. Inserted between FF1 and FF3 in the middle phases 02, 03 data paths is a transparent latch L2 having two enables according to the present invention such that the latch L2 and flip-flop FF3 form a phase-selectable flip-flop.

Figure 4:
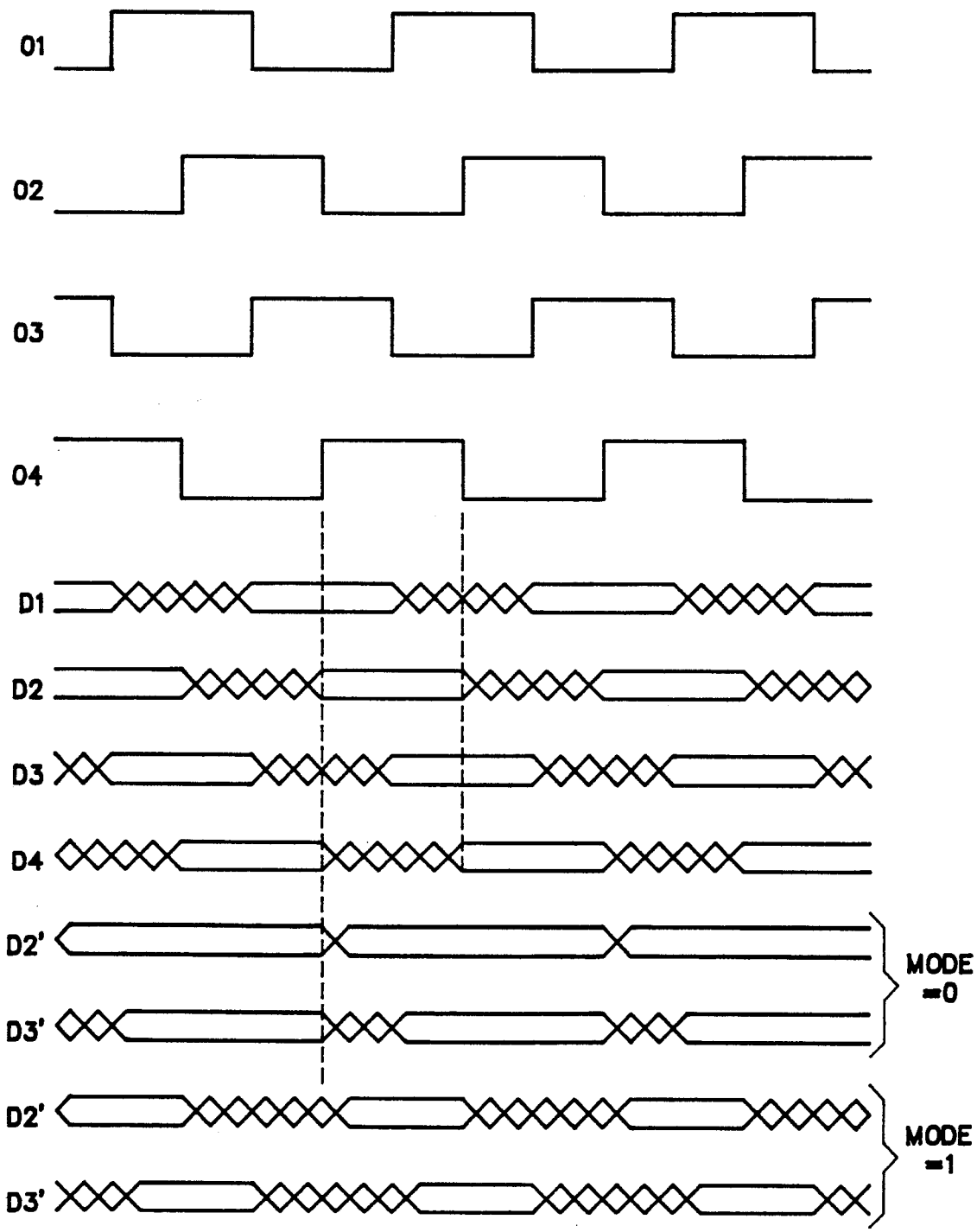
FIG. 4 is an idealized timing diagram view for the four-phase data login circuit of FIG. 3 showing the difference in operation between MODE=0 and MODE=1.

In operation as shown in FIG. 4 since the final data output transfer occurs at the leading edge of the fourth phase clock, 04, the phase two and phase three data is in an uncertainty region. To assure that the data at phase two and three is not output from flip-flop stage FF3 during such an uncertainty period, latch stage L2 is inserted in the data paths for phases two and three between the output of the flip-flop stage FF1 and the input of the output flip-flop stage FF3. With the MODE low the data is latching in to the latch stage L2 at the falling edge of the phase four, clock pulse during a period when there is no instability in the phase two and three data. The result is to extend the phase two and phase three data by a half a clock cycle and a quarter clock cycle, respectively, so that when the rising phase four clock pulse edge is applied to the output stages FF3 there is no uncertainty in any of the data output.

Thus the present invention provides a phase-selectable flip-flop which upon command latches data either on the rising or falling edge of a clock pulse by using a dual enable transparent latch in series with a D-type flip-flop.

What is claimed is:

1. A phase-selectable flip-flop comprising:
an input transparent latch having a data input, a data output, and two enable inputs, a clock being applied to one enable input and a command being applied to the other enable input; and
a flip-flop connected to the data output of the input transparent latch, the flip-flop being clocked by the clock, such that when the command is in a first state the input transparent latch is held transparent and the output of the phase-selectable flip-flop is that data clocked into the flip-flop on the rising edge of the clock, and when the command is in a second state the output of the phase-selectable flip-flop is that data latched by the input transparent latch on the falling edge of the clock and clocked into the flip-flop on the next rising edge of the clock.

2. A four-phase login circuit of the type having an input flip-flop in series with an output flip-flop for each of the four phase paths, the four-phase login circuit further comprising a dual-enable input transparent latch in series between the input flip-flop and the output flip-flop in at least one of the phase paths, one of the phase clocks in a phase path without the transparent latch being input to one enable input and a command being input to the other enable input of the transparent latch such that when the command is in one state for high frequency sample rates the transparent latch delays the data by a half clock cycle, and when the command is in a second state for low frequency sample rates the data is not delayed by the transparent latch.

* * * * *